United States Patent
Bakker et al.

(10) Patent No.: US 6,262,626 B1
(45) Date of Patent: Jul. 17, 2001

(54) CIRCUIT COMPRISING MEANS FOR REDUCING THE DC-OFFSET AND THE NOISE PRODUCED BY AN AMPLIFIER

(75) Inventors: Anthonius Bakker, Delft; Johan H. Huijsing, Schipluiden, both of (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/439,240

(22) Filed: Nov. 12, 1999

(30) Foreign Application Priority Data

Nov. 12, 1998 (EP) .................................................. 98203827

(51) Int. Cl.[7] ...................................................... H03F 1/02
(52) U.S. Cl. .................................. 330/9; 330/69; 327/124
(58) Field of Search ................................. 330/9, 51, 69; 327/124, 307

(56) References Cited

U.S. PATENT DOCUMENTS

| | | | |
|---|---|---|---|
| 4,048,574 | * 9/1977 | Barbier et al. ............................ 330/9 |
| 4,392,112 | 7/1983 | Schade, Jr. ............................ 330/252 |
| 4,587,443 | * 5/1986 | Plassche ................................ 307/353 |
| 5,410,270 | * 4/1995 | Rybicki et al. ............................ 330/9 |
| 5,486,788 | * 1/1996 | Schlager et al. ............................ 330/9 |
| 5,600,275 | * 2/1997 | Garavan ................................ 327/307 |
| 5,663,680 | * 9/1997 | Nordeng ................................ 330/9 |

* cited by examiner

Primary Examiner—Robert Pascal
Assistant Examiner—Henry Choe

(57) ABSTRACT

An amplifier (AMP) is provided with a pair of choppers ($CHP_i, CHP_o$) in order to reduce the DC-offset and the noise produced by the amplifier (AMP). To obtain an optimal noise reduction the pair of choppers ($CHP_i, CHP_o$) operate on a high frequency. As a result the DC-offset cancellation is not optimal because a so-called charge injection of the switches in the pair of choppers ($CHP_i, CHP_o$) produces a DC-offset. To overcome this problem the amplifier (AMP) is further provided with further offset cancellation means which are for example formed by a further pair of choppers ($CHP_{fi}, CHP_{fo}$). This further pair of choppers ($CHP_{fi}, CHP_{fo}$) operates on a relatively low frequency. The combination of the pair of choppers ($CHP_i, CHP_o$) and the further pair of choppers ($CHP_{fi}, CHP_{fo}$) guarantees an optimal DC-offset cancellation as well as an optimal noise cancellation.

6 Claims, 2 Drawing Sheets

CIRCUIT COMPRISING MEANS FOR REDUCING THE DC-OFFSET AND THE NOISE PRODUCED BY AN AMPLIFIER

BACKGROUND OF THE INVENTION

The invention relates to a circuit comprising an amplifier comprising an input for receiving an input signal from an input of the circuit, and an output for delivering an output signal to an output of the circuit; and means for reducing the DC-offset and the noise produced by the amplifier.

Such a circuit is known from the general state of the art as shown in FIG. 1. The known circuit comprises an amplifier AMP having a differential input 5;6 comprising an input node 5 and an input node 6, and a differential output 7;8 comprising an output node 7 and an output node 8. The circuit further comprises an input chopper $CHP_i$ arranged in cascade in between a differential input 1;2 of the circuit and the differential input 5;6 of the amplifier AMP, and an output chopper $CHP_o$ synchronised with the input chopper $CHP_i$, which output chopper $CHP_o$ is arranged in cascade in between the differential output 7;8 of the amplifier AMP and a differential output 3;4 of the circuit. The operation of the known circuit is as follows. An input signal $V_{in}$ is supplied to the differential input 1;2. In response to the input signal $V_{in}$ an output signal $V_{out}$ is delivered to the differential output 3;4. The input chopper $CHP_i$ is arranged for alternately coupling either input terminals 1 and 2 of the differential input 1;2 to respectively input nodes 5 and 6 of the differential input 5;6 during a first phase $PHi_1$, or input terminals 1 and 2 of the differential input 1;2 to respectively input nodes 6 and 5 of the differential input 5;6 during a second phase $PHi_2$. The output chopper $CHP_o$ is arranged for alternately coupling either output nodes 7 and 8 of the differential output 7;8 to respectively output terminals 3 and 4 of the differential output 3;4 during a first phase $Phi_1$, or output nodes 7 and 8 of the differential output 7;8 to respectively output terminals 4 and 3 of the differential output 3;4 during a second phase $PHi_2$. The input signal $V_{in}$ is converted to the output signal $V_{out}$ in virtually the same manner as in the case that the input chopper $CHP_i$ and the output chopper $CHP_o$ would not have been present. However by the presence of the input chopper $CHP_i$ and the output chopper $CHP_o$ the offset produced by the amplifier AMP, which offset is denoted as $V_{os}$ in FIG. 1, is eliminated. Also the noise produced by the amplifier AMP is significantly reduced for frequencies lower than the switching frequency of the switches in the input chopper $CHP_i$ and the output chopper $CHP_o$. For the purpose of reducing the noise produced by the amplifier AMP the aforementioned switching frequency must be as high as possible.

A problem of the known circuit is that for a high switching frequency the so-called charge injection caused by the switches of the input chopper $CHP_i$ and the output chopper $CHP_o$ causes a DC-offset in the output signal $V_{out}$. Thus with the known circuit an optimal DC-offset reduction can only be accomplished if the switching frequency is low. In that case the noise reduction is not optimal. On the other hand an optimal noise reduction is accomplished if the switching frequency is high. In that case however the DC-offset reduction is not optimal. Thus, with the known circuit, an optimal DC-offset reduction and an optimal noise reduction can not be accomplished at the same time.

SUMMARY OF THE INVENTION

It is an object of the invention to provide an improved circuit for reducing the noise and the offset of an amplifier. To this end, according to the invention, the circuit of the type defined in the opening paragraph is characterized in that the circuit further comprises further means for further reducing the DC-offset produced by the amplifier.

The invention is based on the insight that the further means do not have to cope with the reduction of noise since the noise reduction is already optimally accomplished by the known circuit. In other words by the inventive circuit the problem of DC-offset reduction and the problem of noise reduction of the amplifier are uncoupled.

The further means for further reducing the DC-offset produced by the amplifier may for instance comprise a further input chopper arranged in cascade in between the differential input of the circuit and the input chopper, and a further output chopper arranged in cascade in between the output chopper and the differential output of the circuit. The further output chopper is synchronised with the further input chopper. The switching frequency of the switches in the further input chopper and the further output chopper is significantly lower than the switching frequency of the switches in the input chopper and the output chopper.

The further means for further reducing the DC-offset produced by the amplifier may also be formed by other noise reduction systems. It may for example be formed in the manner as claimed in claim 6.

BRIEF DESCRIPTION OF THE DRAWINGS

The invention will be described in more detail with reference to the accompanying drawings, in which.

In these Figures parts or elements having like functions or purposes bear the same reference symbols.

DESCRIPTION OF THE PREFERRED EMBODIMENTS

Figure 1:
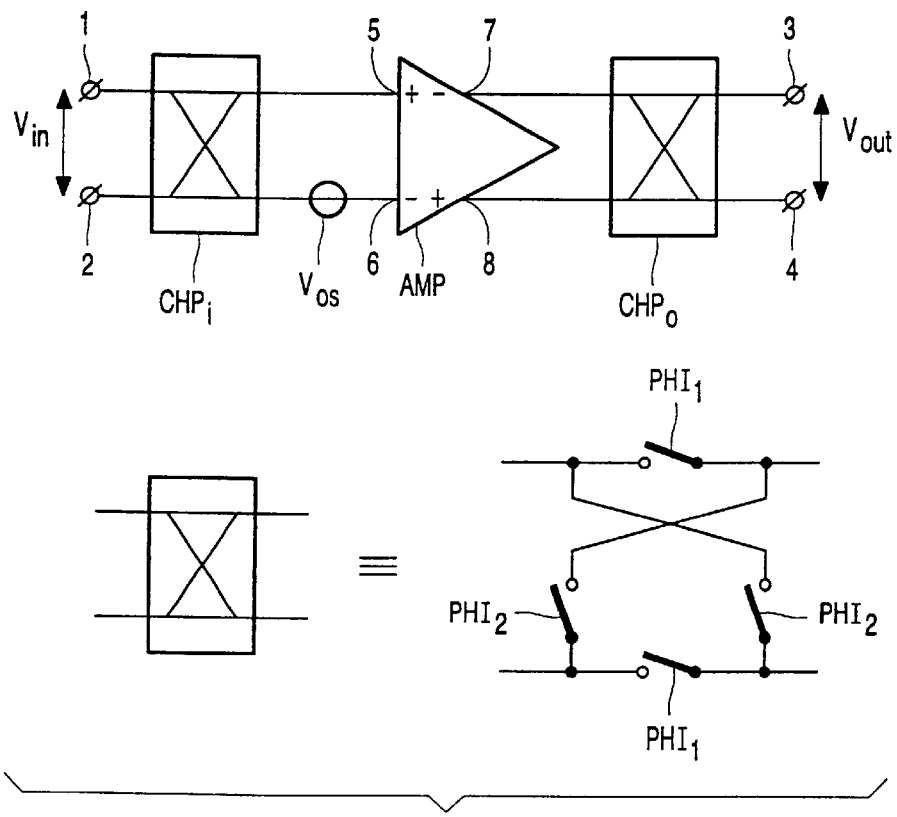
FIG. 1 is a circuit diagram of a known circuit for reducing the DC-offset and the noise of an amplifier.
Figure 2:
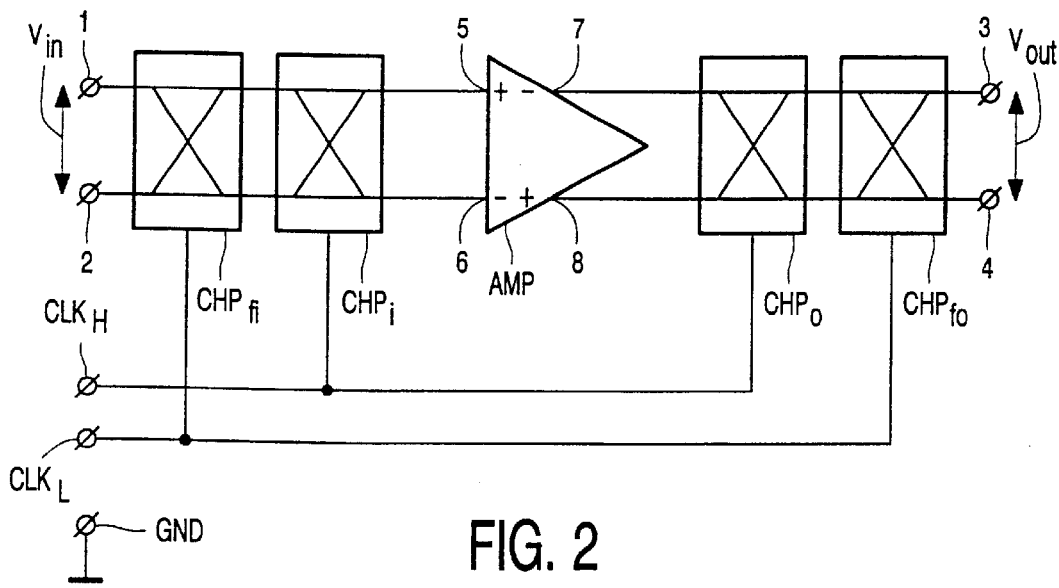
FIG. 2 is a circuit diagram of a first embodiment of a circuit according to the invention.

FIG. 2 shows a circuit diagram of a first embodiment of a circuit according to the invention. The circuit comprises an amplifier AMP having input nodes 5 and 6 for receiving an input signal $V_{in}$ which is available between input terminals 1 and 2 of the circuit, and output nodes 7 and 8 for delivering an output signal $V_{out}$ to output terminals 3 and 4 of the circuit. For the purpose of reducing the DC-offset and the noise produced by the amplifier AMP the circuit is further provided with an input chopper $CHP_i$, a further input chopper $CHP_{fi}$, an output chopper $CHP_o$, and a further output chopper $CHP_{fo}$. The input chopper $CHP_i$ and the further input chopper $CHP_{fi}$ are cascaded in between the input terminals 1 and 2 and the input nodes 5 and 6, whereby the further input chopper $CHP_{fi}$ is cascaded in between the input terminals 1 and 2 and the input chopper $CHP_i$. The output chopper $CHP_o$ and the further output chopper $CHP_{fo}$ are cascaded in between the output nodes 7 and 8 and the output terminals 3 and 4, whereby the further output chopper $CHP_{fi}$ is cascaded in between the output chopper $CHP_o$ and the output terminals 3 and 4.

The operation of the circuit is as follows. The input chopper $CHP_i$ and the output chopper $CHP_o$ receive a high frequency clock signal which is available between a first clock terminal $CLK_H$ and a reference terminal GND. By so doing the DC-offset and the noise produced by the amplifier AMP is significantly reduced. For obtaining an optimal noise reduction the frequency of the high frequency clock signal is as high as possible. In principle the DC-offset produced by the amplifier AMP would be virtually cancelled. However the so-called charge injections caused by the switches in the input chopper $CHP_i$ and the output chopper $CHP_o$ cause a DC-offset at the output of the output chopper $CHP_o$. To remove the DC-offset at the output of the output chopper $CHP_o$ the further input chopper $CHP_{fi}$ and the further output chopper $CHP_{fo}$ receive a low frequency clock signal which is available between a second clock terminal $CLK_L$ and the reference terminal GND. Because the further input chopper $CHP_{fi}$ and the further output chopper $CHP_{fo}$ operate at a relatively low frequency the further input chopper $CHP_{fi}$ and the further output chopper $CHP_{fo}$ do not introduce a DC-offset. The noise reduction of the further input chopper $CHP_{fi}$ and the further output chopper $CHP_{fo}$ is not optimal. This causes however no problem since the noise produced by the amplifier AMP is already cancelled by the input chopper $CHP_i$ and the output chopper $CHP_o$. Thus the combination of the input chopper $CHP_i$, the output chopper $CHP_o$, the further input chopper $CHP_{fi}$ and the further output chopper $CHP_{fo}$ guarantee an optimal DC-offset reduction and also an optimal noise reduction of the amplifier AMP. It is to be stated that though the frequency of the low frequency clock signal must be relatively low, it must not be chosen unnecessary low since the maximum transfer frequency of the circuit is in practice limited to half the value of the low frequency clock signal.

Figure 3:
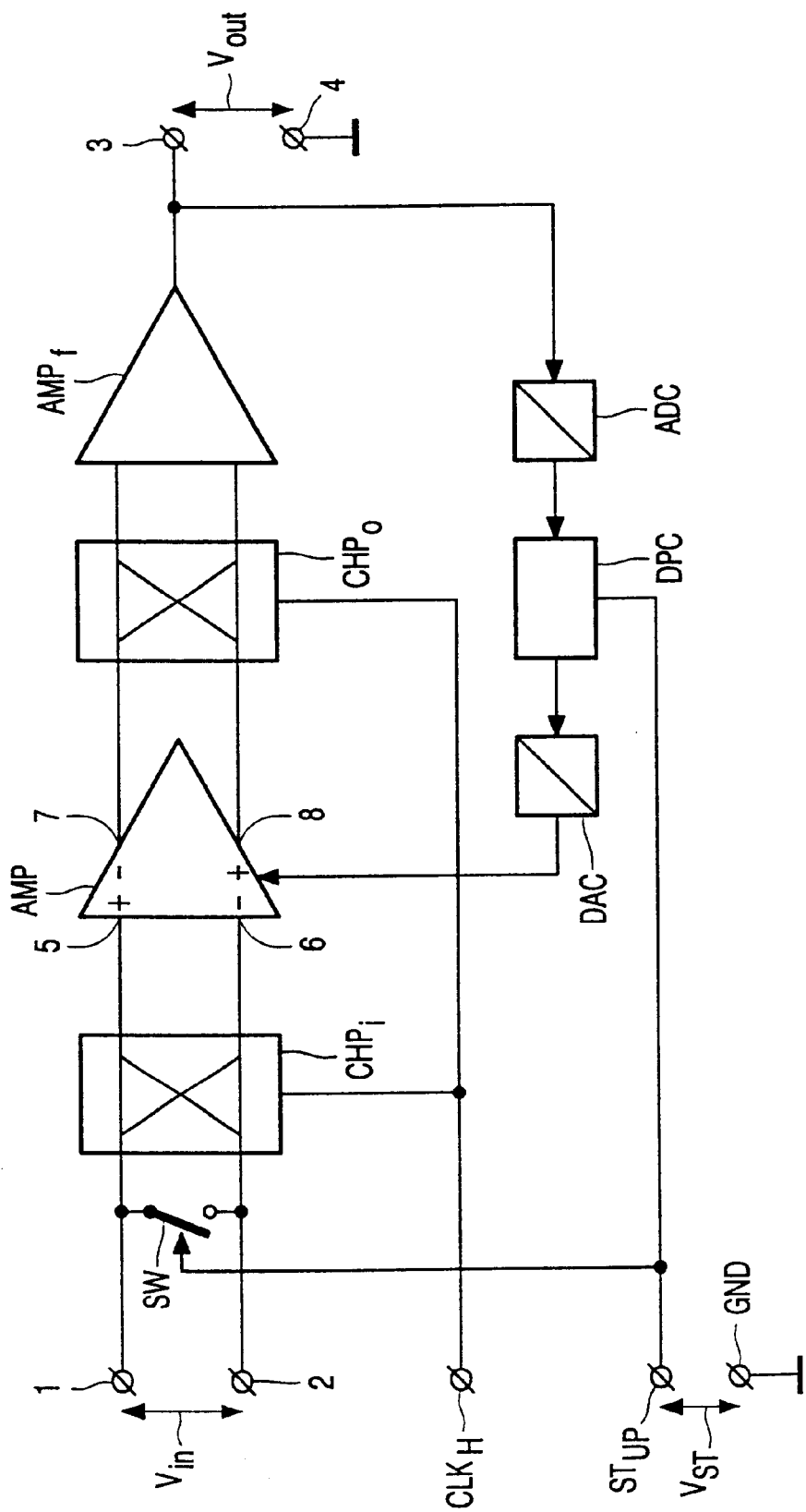
FIG. 3 is a circuit diagram of a second embodiment of a circuit according to the invention.

FIG. 3 shows a circuit diagram of a second embodiment of a circuit according to the invention. An important difference with respect to the first embodiment is that the circuit does not comprise the further input chopper $CHP_{fi}$ and the further output chopper $CHP_{fo}$. The cancellation of the DC-offset at the output of the output chopper $CHP_o$ is carried out in a different manner. This has the advantageous effect that the maximum transfer frequency of the circuit is much higher. The circuit is provided with a switch SW connected in between the input terminals 1 and 2. A control electrode of the switch SW is connected to a control terminal $ST_{UP}$. The circuit further comprises an analog to digital converter ADC with an input connected to the output terminal 3, and with an output; a digital processing circuit DPC with an input connected to the output of the analog to digital converter ADC, and an output; and a digital to analog converter DAC with an input connected to the output of the digital processing circuit DPC, and an output coupled to the amplifier AMP.

The operation of the circuit is as follows. At the start-up of the circuit the inputs of the input chopper $CHP_i$ is short-circuited under control of a start-up signal $V_{ST}$ which is available between the control terminal $ST_{UP}$ and the reference terminal GND. The DC-offset at the output of the output chopper $CHP_o$ is measured and fed back to the amplifier AMP in order to adapt the DC-offset of the amplifier AMP. This measurement is in fact accomplished by sampling the signal at the output of the output chopper $CHP_o$ during the start-up of the circuit. The sampling is accomplished in the digital domain in order to avoid the problem of leakage of a necessary sampling capacitor in the case that the sampling would be accomplished in the analog domain. For this reason the analog to digital converter ADC converts the analog output signal $V_{out}$ to a digital representation of the analog output signal $V_{out}$. The digital sampling is then performed by the digital processing circuit DPC. The digital output signal delivered by the digital processing circuit DPC is then converted to an analog signal by the digital to analog converter DAC for adapting the DC-offset of the amplifier AMP. The feedback loop created by the analog to digital converter ADC, the digital processing circuit DPC and the digital to analog converter DAC is active until the DC-offset at the output 3;4 of the circuit is virtually zero. Then the start-up signal $V_{ST}$ switches off the switch SW and the circuit is then ready for transferring the input signal $V_{in}$ to the output signal $V_{out}$. The adaption of the DC-offset of the amplifier AMP can for instance be accomplished by controlling a current of one transistor of a differential input pair within the amplifier AMP. By way of example the differential signal from the output chopper $CHP_o$ is transferred to a single-ended output signal $V_{out}$ by a further amplifier $AMP_f$.

If the circuit does not have to operate continuously the "start-up procedure" can be repeated now and then, for instance by doing a re-calibration after each sampling performed in the digital domain. This has the advantage that a potential DC-offset due to a temperature change after the completion of the start-up, is avoided.

Though various signals are indicated as differential signals with regard to the first and the second embodiments the invention can also be carried out with single-ended signals. So for instance in FIG. 2 the input terminal 2 and/or the output terminal 4 could also be connected to the reference terminal GND. The inventive circuit can be implemented with discrete components as well as with an integrated circuit. All types of transistors can be used.

What is claimed is:

1. A circuit comprising an amplifier producing a DC-offset and noise, an input for receiving an input signal from an input of the circuit, and an output for delivering an output signal to an output of the circuit; and, for reducing the DC-offset and the noise produced by the amplifier; a first input chopper arranged in cascade in between the input of the circuit and the input of the amplifier, a first output chopper synchronized with the first input chopper and arranged in cascade in between the output of the amplifier and the output of the circuit, another input chopper arranged in cascade in between the input of the circuit and the first input chopper, and another output chopper synchronized with the other input chopper and arranged in cascade in between the first output chopper and the output of the circuit.

2. A circuit as claimed in claim 1, characterized in that the first input chopper and the first output chopper are operative as high frequency choppers, and that the other input chopper and the other output chopper are arranged as low frequency choppers.

3. A circuit comprising an amplifier susceptible to producing a DC-offset and noise in response to an input signal, the circuit comprising: inside chopper means, arranged in cascade with and synchronized on either side of the amplifier, for reducing the DC-offset and the noise produced by the amplifier, and outside chopper means, arranged in cascade with and synchronized on opposite outer sides of the inside chopper means, for further reducing the DC-offset produced by the amplifier.

4. A circuit as claimed in claim 3, characterized in that the inside chopper means comprises an input chopper arranged in cascade in between the input of the circuit and the amplifier, and an output chopper synchronized with the input chopper, which output chopper is arranged in cascade in between the amplifier and the output of the circuit.

5. A circuit as claimed in claim 4, characterized in that the outside chopper means comprises a further input chopper arranged in cascade in between the input of the circuit and the input chopper; and a further output chopper synchronized with the further input chopper, which further output chopper is arrange in cascade in between the output chopper and the output of the circuit.

6. A circuit as claimed in claim 5, characterized in that the input chopper and the output chopper are operative as high frequency choppers and that the further input chopper and the further output chopper are arranged as low frequency choppers.

* * * * *